(12) United States Patent
Kusner et al.

(10) Patent No.: US 6,284,982 B1
(45) Date of Patent: Sep. 4, 2001

(54) METHOD AND COMPONENT FOR FORMING AN EMBEDDED RESISTOR IN A MULTI-LAYER PRINTED CIRCUIT

(75) Inventors: Mark Kusner, Gates Mills; Michael A. Centanni, Parma, both of OH (US)

(73) Assignee: GA-TEK Inc., Eastlake, OH (US)

( * ) Notice: Subject to any disclaimer, the term of this patent is extended or adjusted under 35 U.S.C. 154(b) by 0 days.

(21) Appl. No.: 09/641,304

(22) Filed: Aug. 18, 2000

(51) Int. Cl.$^7$ ...................................................... H05K 1/03
(52) U.S. Cl. ........................... 174/255; 174/260; 174/256
(58) Field of Search ................................... 174/250, 255, 174/256, 259, 262; 361/751, 792, 793, 794, 795, 763

(56) References Cited

U.S. PATENT DOCUMENTS

| | | | |
|---|---|---|---|
| 5,072,074 | * 12/1991 | DeMasso et al. | 174/254 |
| 5,359,496 | * 10/1994 | Kornrumpf et al. | 361/795 |
| 5,362,534 | * 11/1994 | McKenney et al. | 428/40 |
| 5,450,286 | * 9/1995 | Jacques et al. | 361/749 |
| 5,578,796 | * 11/1996 | Bhatt et al. | 174/260 |
| 5,652,055 | * 7/1997 | King et al. | 428/343 |
| 6,021,050 | * 3/2000 | Ehman et al. | 361/793 |
| 6,201,194 | * 3/2001 | Lauffer et al. | 174/264 |

OTHER PUBLICATIONS

Metech, Inc. specification sheet entitled: METECH, *Silver Conductor 2700*, Revised 10/99, 1 page.
Metech, Inc. specification sheet entitled: METECH, *8000 Series Resistor Compositions*, Revised 11/99, 1 page.
Information obtained from the web site: http://www.me-techinc.com/solutions/clarostat.html, SOLUTIONS entitled: "Polymer Resistor Project Proves a 'win–win–win'," 4 pages, dated Jul. 20, 2000.
Information obtained from the web site: http://www.me-techinc.com/solutions/manyapps.html, SOLUTIONS entitled: "Metech Resistor Pastes Serve Many Applications," 2 pages, dated Jul. 20, 2000.

* cited by examiner

Primary Examiner—Jeffrey Gaffin
Assistant Examiner—Jose H. Alcala
(74) Attorney, Agent, or Firm—Mark Kusner; Michael A. Centanni

(57) ABSTRACT

A component for use in forming a multi-layer printed circuit comprised of a film substrate formed of a first polymeric material. At least one layer of a flash metal is applied to a first side of the film substrate, and at least one layer of copper is applied on the layer of flash metal. A discrete area of a resistive material is disposed on a second side of the film substrate.

5 Claims, 3 Drawing Sheets

METHOD AND COMPONENT FOR FORMING AN EMBEDDED RESISTOR IN A MULTI-LAYER PRINTED CIRCUIT

FIELD OF THE INVENTION

The present invention relates generally to printed circuits, and more specifically, to a method and component for manufacturing embedded resistive elements in printed circuit boards.

BACKGROUND OF THE INVENTION

In recent years, printed circuit components have become widely used in a variety of electronic devices. Of particular interest are multi-layer printed circuit board laminates which have been developed to meet the demand for miniaturization of electronic components and the need for printed circuit boards having a high density of electrical interconnections and circuitry. In the manufacture of multi-layer printed circuit boards, conductive foils, which are usually copper foils, are secured to opposite sides of a core which is conventionally a reinforced or non-reinforced dielectric. (Throughout this specification, the use of the term "core" is meant to include any one of a variety of core materials, all of which may be reinforced or non-reinforced and may include an epoxy, polyester, polyimide, a polytetrafloroethylene, and in some applications, a core material which includes previously formed printed circuits).

The process includes one or more etching steps in which the undesired or unwanted copper is removed by etching away portions of the conductive foil from the laminate surface to leave a distinct pattern of conductive lines and formed elements on the surface of the etched laminate. The etched laminate and other laminate materials may then be packaged together to form a multi-layer circuit board package. Additional processing, such as hole drilling and component attaching, will eventually complete the printed circuit board product.

The trend in recent years has been to reduce the size of electronic components and provide printed circuit boards having multi-chip modules, etc. This results in a need to increase the number of components, such as surface-mount components provided on the printed circuit board. This in turn results in a so-called "densely populated" or simply "dense" printed circuit board. A key to providing a densely populated printed circuit board is to produce close and fine circuit patterns on the outer surfaces (i.e., the exposed surfaces) of the resulting multi-layer printed circuit board. The width and spacing of conductive paths on a printed circuit board are generally dictated by the thickness of the copper foil used thereon. For example, if the copper foil has a thickness of 35 $\mu$m (which is a conventional 1-ounce foil used in the manufacture of many printed circuits), exposing the printed circuit board to an etching process for a period of time to remove such a foil thickness will also reduce the width of the side areas of the printed circuit path in approximately the same amount. In other words, because of the original thickness of the copper foil, a printed circuit board must be designed to take into account that an etching process will also eat away the sides of a circuit path (i.e., undercut a masking material). In other words, the thickness of the spacings between adjacent circuit lines is basically limited by the thickness of the copper foil used on the outer surface of the multi-layer printed circuit board.

Thus, to produce "densely populated" printed circuit boards, it is necessary to reduce the thickness of the copper, at least on the outermost surface of the multi-layer printed circuit package. (The thickness of the copper foil sheet is generally limited by the ability of a foil manufacturer to handle and transport such sheets. In this respect, as the thickness of the foil decreases below 35 $\mu$m, the ability to physically handle such foil becomes more difficult).

Many printed circuit boards also include conductive layers containing patterned components that perform as specific, discrete components. One such discrete component is a resistive element. It is conventionally known to form a resistive element using a resistor foil. A resistor foil is basically a copper foil having a thin layer of a resistive material, typically a metal or metal alloy, deposited onto one surface thereof. The resistor foil is attached to a dielectric substrate with the resistor material being adhered to the dielectric substrate. Portions of the copper foil and resistive material are etched away, using conventionally known etching and masking techniques, to produce a trace line comprised of copper and the resistive material therebelow. A section of the copper layer is removed leaving only a resistive material trace line remaining on the surface of the dielectric to connect the two separated ends of the copper portion of the trace line. Because the resistive material typically has a conductivity less than copper, it essentially acts as a resistor between the separated ends of the copper portion of the trace line. As will be appreciated, the foregoing subtractive procedure requires several masking and etching steps to remove unwanted copper and resistive material to form the actual resistive element. Such steps are both time-consuming and expensive. Further, the resistive materials used in forming the resistor foil are somewhat limited to those materials that can be etched using known etching chemicals. In this respect, the resistive material must be material that is compatible with chemicals used to etch copper.

The present invention provides an outer surface component for forming resistive elements in a multi-layer printed circuit board and a method of forming embedded resistive elements in a multi-layer printed circuit board that utilizes a process that is not limited by known resistive materials.

SUMMARY OF THE INVENTION

It is an object of the present invention to provide a component for use in forming multi-layer circuits.

Another object of the present invention is to provide a component for use as the outermost layer of a multi-layer printed circuit, wherein the component has an exceptionally thin layer of copper that facilitates fine circuit lines and a "densely populated" circuit surface.

Another object of the present invention is to provide a component as described above that has resistive elements thereon for forming embedded resistors within the multi-layered printed circuit.

Another object of the present invention is to provide a component as described above that has an exposed copper surface having improved photoresist adhesion properties that further facilitates the creation of fine circuit lines and a "densely populated" circuit surface by an etching process.

Another object of the present invention is to provide a component as described above, wherein one side of the component includes an adhesive layer for attachment to core laminates.

Another object of the present invention is to provide an outer surface laminate as described above, wherein the outer surface laminate is comprised of a polymeric film having a thin layer of copper adhered to one side of the polymeric film and at least one resistive element applied to a second side of the polymeric film.

These and other objects and advantages will become apparent from the following description of preferred embodiments of the invention, taken together with the accompanying drawings.

BRIEF DESCRIPTION OF THE DRAWINGS

The invention may take physical form in certain parts and arrangement of parts, embodiments of which are described in detail in the specification and illustrated in the accompanying drawings, wherein.

DETAILED DESCRIPTION OF PREFERRED EMBODIMENT

Figure 1:
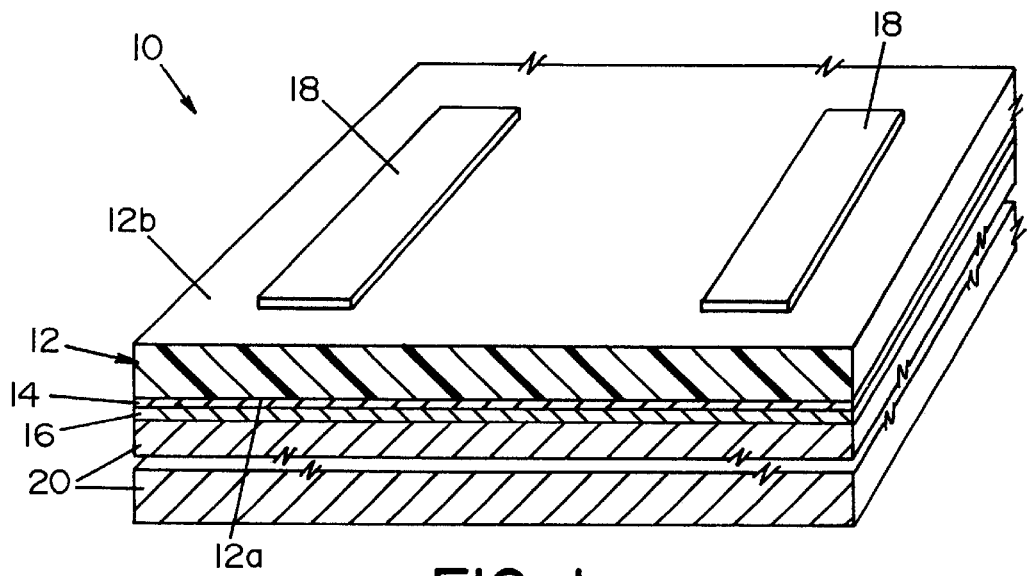
FIG. 1 is a perspective view of a component for use in forming a multi-layer printed circuit board having embedded resistors, illustrating a preferred embodiment of the present invention.

Referring now to the drawings wherein the showings are for the purpose of illustrating preferred embodiments of the invention only, and not for the purpose of limiting same, FIG. 1 shows a cross-sectional view of a surface component 10 illustrating a preferred embodiment of the present invention. Broadly stated, surface component 10 is comprised of a polymeric film 12 having a first surface 12a and a second surface 12b. A thin metallic layer 14 of a flash metal (conventionally referred to as a "tiecoat") is applied to surface 12a of polymeric film 12. At least one metallic layer 16, preferably formed of copper, is applied to flash layer 14. One or more discrete areas 18 of resistive material are formed on surface 12b of polymeric film 12. In the embodiment shown, an optional support substrate 20, that constitutes a discardable element in the forming of a printed circuit board, is shown attached to metallic layer 16 along the periphery thereof, to protect the surface of metallic layer 16 and to provide structural rigidity to component 10.

Polymeric film 12 is preferably formed of polyimide and has a thickness of between 12.5 μm and 125 μm. Specific examples of materials that may form polymeric film 12 include Kapton-E or Kapton-HN (manufactured by I.E. DuPont), Upilex-S or Upilex-SGA (manufactured by Ube) and Apical NP (manufactured by Kaneka).

Flash layer 14 may be formed from metals selected from the group consisting of chromium, nickel, titanium, aluminum, vanadium, silicon, iron and alloys thereof. Flash layer 14 is preferably formed of chromium and preferably has a thickness of between 0 Å(none) and 500 Å, and more preferably, between about 50 Å to 200 Å.

As indicated above, metallic layer 16 is preferably formed of copper, and has a preferable thickness of between 0.1 μm (1000 Å) and 70 μm. The copper forming metallic layer or layers 16 may be applied by vacuum-metallization, electrodeposition, electroless deposition or combinations thereof on flash layer or layers 14. In accordance with a preferred embodiment of the present invention, metallic layer 16 is electrodeposited onto flash layer 14.

Areas 18 are preferably thin layers formed of a material having a resistivity greater than copper. Areas 18 may be formed of a metal deposited onto surface 12b by conventionally known deposition processes such as vacuum-metallization, electrodeposition, electroless deposition or combinations thereof. By way of example, but not limitation, metals deposited onto surface 12b may include chromium, nickel, titanium, aluminum, molybdenum, tantalum, gold, tin, indium, vanadium, silicon, iron and alloys thereof. The thickness of areas 18 is preferably between about 50 Å and about 300 Å. As shall be understood from a further reading of the specification, the thickness of areas 18 (as well as their width and length) will depend upon the desired resultant resistance of the resistive element formed thereby.

Areas 18 may also be formed of a polymer ink that is sprayed, wiped or painted onto surface 12b. Resistive polymer inks manufactured and sold by Metech of Elverson, Pennsylvania may find advantageous application as part of component 10.

In the embodiment shown, areas 18 are shown as elongated, rectangular strips of generally uniform width and thickness. As will be appreciated, other shapes may also be used. According to the present invention, areas 18 are formed to be discrete areas isolated from each other.

Support substrate 20 is provided as a temporary, protective covering for metallic layer 16 to protect the outer surface thereof from contamination prior to laminating, and further to provide rigidity to component 10 to prevent cracking or flaking of areas 18 resulting from polymeric film 12 flexing or bending. Accordingly, support substrate 20 is preferably dimensioned, i.e., has a thickness, sufficient to preventing cracking or flaking of areas 18. As will be appreciated, different materials forming areas 18 will require different rigidities from support substrate 20. As indicated above, substrate 20 is removed from component 10 and discarded during formation of a printed circuit board. Substrate 20 is preferably formed of a metal having a polished, substantially contamination-free surface for attachment to metallic layer 16. Substrate 20 may be formed of aluminum, steel, stainless steel, copper or the like. Substrate 20 is attached to the periphery of metallic layer 16, typically by a flexible adhesive.

According to one aspect of the present invention, component 10 is preferably formed as an individual component for later use in forming a multi-layer printed circuit. Component 10 is preferably used as the outermost component in a multi-layer printed circuit, wherein metallic layer 16 forms the outermost layer of the printed circuit.

Figure 2:
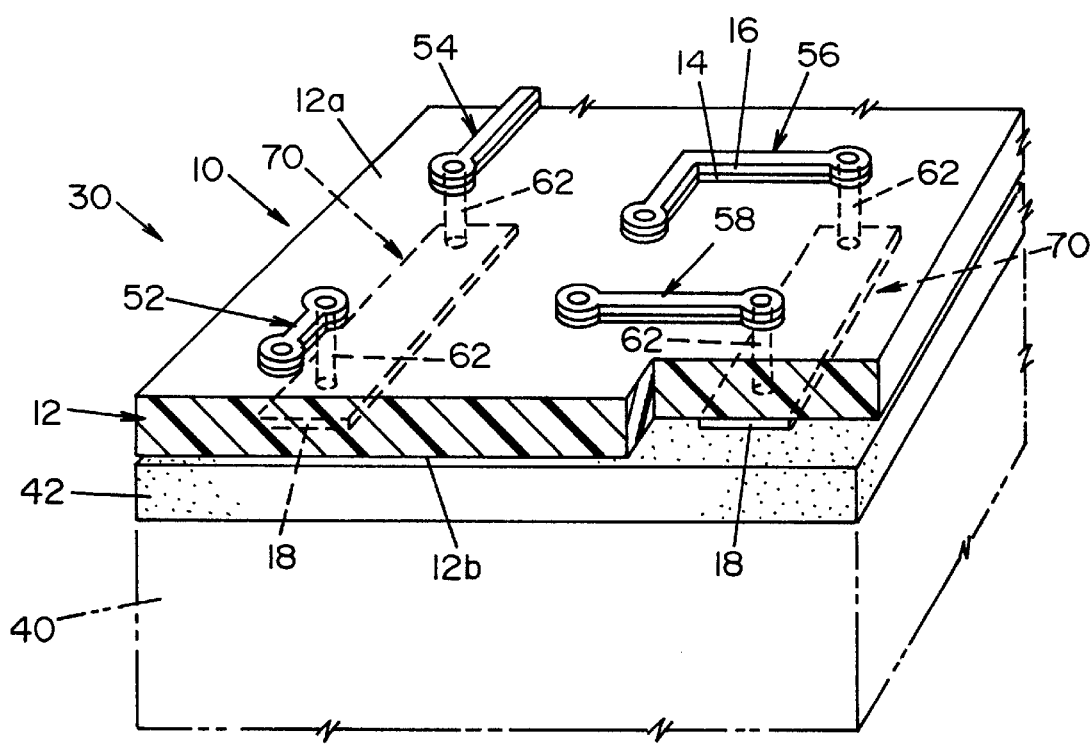
FIG. 2 is a perspective view of the component shown in FIG. 1 attached to a core showing the component with trace lines formed thereon that are connected to an embedded resistor.

FIG. 2 shows a multi-layer printed circuit 30 formed using component 10 as the outer surface sections thereof. Multi-layer printed circuit 30 is generally comprised of an inner laminate section 40, that is shown in phantom in FIG. 2. FIG. 2 shows component 10 after it has been attached, i.e., laminated, to inner laminate section 40 by an adhesive layer 42 and then circuitized by conventionally known processes to form circuit trace lines 52, 54 and 56, 58 on side 12a of polymeric film 12.

More specifically, FIG. 2 illustrates how an embedded resistor 70 may be formed using area 18 on side 12b of component 10. Preferably, the ends of trace lines 56, 58 are disposed in vertical alignment, i.e., in registry, with the ends of area 18, as illustrated in FIG. 2. Through holes 62 are drilled into board 30 using conventional techniques, to connect one end of each trace lines 56, 58 to ends of area 18. Through holes 62 are filled by conventional, electroplating techniques to form a continuous circuit comprised of trace lines 56, 58 and area 18. Since area 18 is formed of a resistive material, it acts as a resistor element to current flow from trace line 56 to trace line 58. FIGS. 1 and 2 thus illustrate how an embedded resistor 70 may be formed by an additive process by forming an area 18 of a resistive material onto polymeric film 12, and then embedding area 18 of a resistive material in a printed circuit 30 and then connecting opposite ends of area 18 to spaced-apart trace lines 56, 58 by through holes 62.

Figure 3:
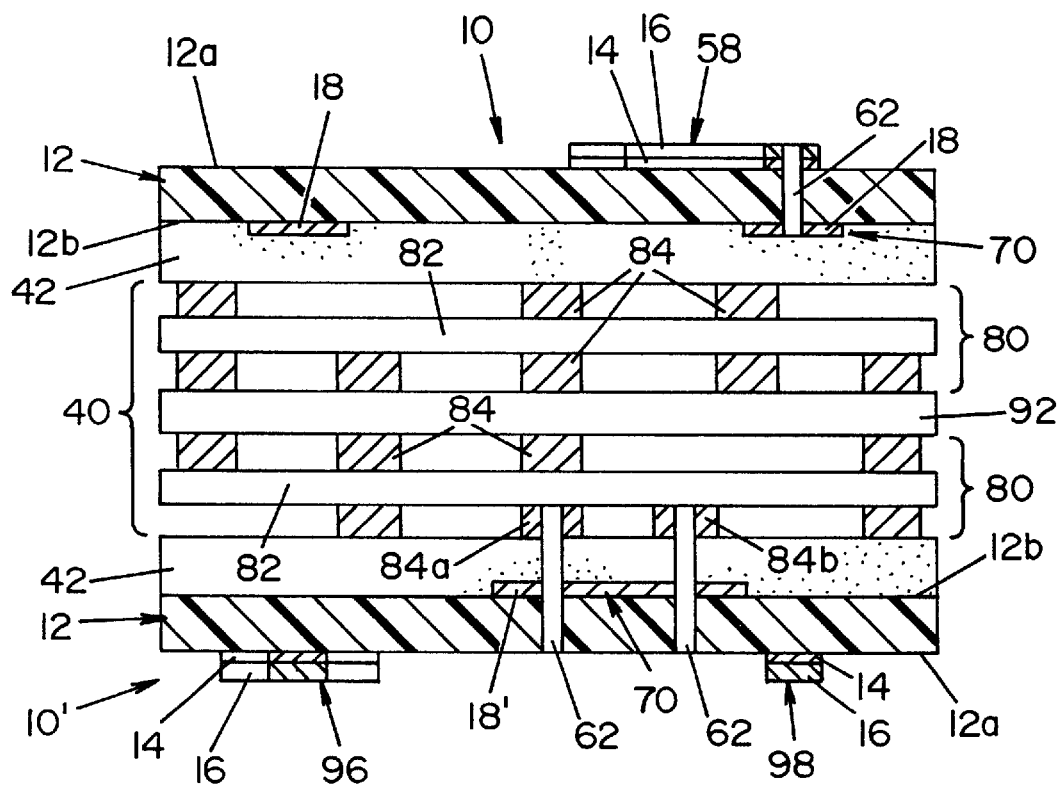
FIG. 3 is a cross-sectional view of a multi-layer printed circuit board formed from components according to the present invention, wherein such components form the outermost elements of the circuit board.

Referring now to FIG. 3, inner laminate section 40 (shown in phantom in FIG. 2) is schematically illustrated in cross-section to show more clearly the connection between trace line 56, 58 and area 18. In FIG. 3, inner laminate 40 is illustrated as comprised of two previously formed printed circuit laminates 80. Circuit laminates 80 are separated by an intermediate dielectric layer 92. Each printed circuit laminate 80 is comprised of an inner core 82 having circuit leads or connectors 84 formed on the outer surfaces thereof. As indicated above, cores 82 may be reinforced or non-reinforced and may include an epoxy, polyester, cyanate ester, bismaleimide triazine, polynorborene, teflon, polyimide or a resinous material, and mixtures thereof, as is conventionally known. Printed circuit laminates 80 are secured to dielectric layer 92, as is conventionally known. As shown in FIG. 3, through hole 62 does not extend through adhesive layer 42, although through hole 62 may extend into adhesive layer 42. FIG. 3 thus illustrates how an embedded resistor 70 can be formed using trace lines 56, 58 on the surface of multi-layer circuit 30.

FIG. 3 also illustrates how component 10 may also be used to form an embedded resistor using internal trace lines. In this respect, FIG. 3 shows a lower component designated 10'. Like component 10, component 10' is comprised of a polymeric film 12, a metallic flash layer 14 (tiecoat), a metallic layer 16 and at least one area 18' of a resistive material. Flash layer 14 and metallic layer 16 are masked and etched by conventional techniques to form circuit trace lines 96, 98 on surface 12a of polymeric film 12. Area 18' of a resistive material is oriented and disposed to be in spaced relationship with circuit leads 84a, 84b on circuit laminate 80. Through holes 62 extending through polymeric film 12, area 18', adhesive layer 42 and into the ends of circuit leads 84a, 84b, electrically connect circuit leads 84a, 84b to the ends of the resistive material of area 18'. Area 18' thus forms an embedded resistor element to embedded circuit leads 84a, 84b of printed circuit laminate 80.

The resulting multi-layer printed circuit 30 thus has components 10, 10' as the outermost components, with exposed metallic layers 16 available for a subsequent etching process to define a specific surface path or pattern from metallic layer 16. Importantly, as indicated above, because metallic layer(s) 16 are deposited onto a polymeric film 12, the thickness of metallic layer 16 may be extremely thin as compared to conventional metallic foil. As also indicated above, metallic layer 16 may have a thickness as low as 0.1 $\mu$m (1000 Å). Such thin layers of copper on the outer surfaces of multi-layer printed circuit 30 facilitate forming extremely fine and closely spaced circuit lines and patterns by an etching process. (The exposed, electrodeposited copper surface of metallic layer 16 is generally rougher than the typically flat surface of standard copper foils, thereby providing increased photoresist adhesion, which also facilitates forming extremely fine and closely spaced circuit lines and patterns by an etching process). As described above, depositing a resistive material onto side 12b of polymeric film 12 facilitates formation of embedded resistors 70 within multi-layer printed circuit 30. Unlike prior processes, the present invention provides an additive process for forming resistor elements. An advantage of the present invention is that the resistive materials that may be used in forming resistive elements according to the present invention are not limited by their compatibility with etching chemicals that are required for forming resistive elements according to conventionally known subtractive processes. Moreover, the absence of glass fibers (typically found in glass-reinforcing prepregs) makes for easier laser drilling of microvias and through holes to connect trace lines formed from metallic layer 16 with circuit leads 84 on printed circuit laminates 80 or resistive areas 18. Still further, polymeric materials, such as polyimide, have better dielectric properties as compared to conventional glass-reinforced prepregs, thereby providing improved electrical performance, such as for example, reduced attenuation of high speed signals. Furthermore, the high heat stability of materials such as polyimides can provide better resistance to thermal expansions that arise during the chip attachment process. Thus, components 10, 10' as used as an outer surface layer in a multi-layer printed circuit assembly, facilitate a formation of embedded resistors 70 by an additive process, as well as the production of more densely packed multi-layer printed circuit boards.

A contemplated method of forming an embedded resistor within a printed circuit would be as follows:

1) Forming a component 10 as described above, comprised of a polymeric film 12 having on one side thereof a flash layer 14 of a tiecoat metal and a metallic layer 16 deposited on flash layer 14, and on the other side thereof, discrete, isolated areas 18 of resistive material. A support substrate 20 may optionally be provided to protect the exposed surface of metallic layer 16. Substrate 20 may also be provided to prevent flexing or bending of component 10 so as to prevent cracking or separating of certain types of resistive materials forming areas 18.

2) Laminating component 10 to an inner laminate by means of an adhesive, wherein areas 18 are embedded within the resulting component and separated from the inner laminate 40 by an adhesive layer. Lamination of component 10 to an inner laminate 40 comprises compressing component 10 together with elements forming inner laminate 40 under conditions of heat and pressure to create a multi-layer printed circuit.

3) Removing support substrate 20 so as to expose metallic layer 16 and circuitizing metallic layer 16 by conventionally known masking and etching processes to form circuit trace lines from metallic layer 16 and flash layer 14.

4) Drilling through holes through the ends of spaced-apart trace lines, the through holes extending through polymeric film 12 into remote portions of areas 18.

5) Plating or filling the through holes with conductive material to create an electrical connection between the ends of trace lines formed on the outer surface of component 10 and the embedded areas 18 of a resistive material, so as to form a resistive element.

Figure 4:
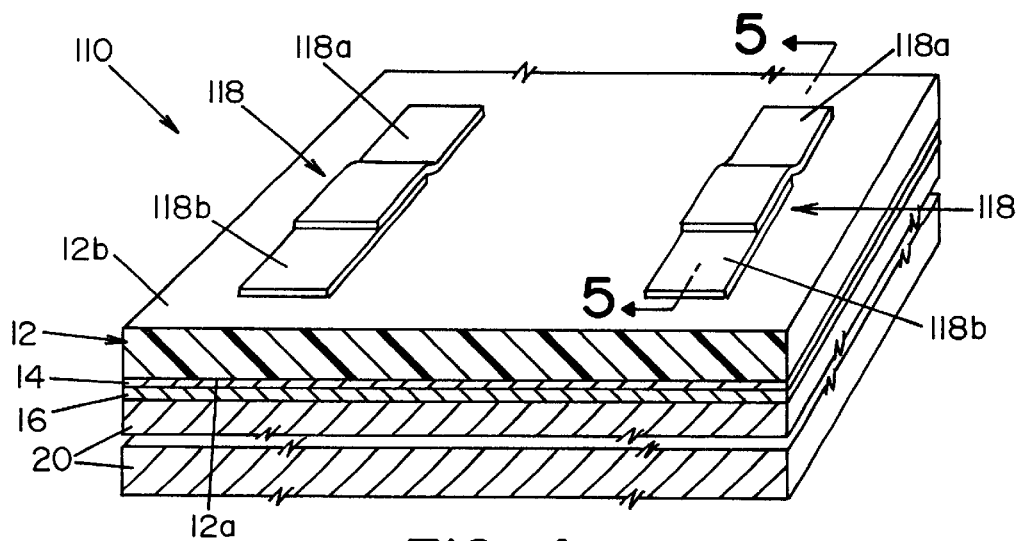
FIG. 4 is a perspective view of a component for use in forming a multi-layer printed circuit having embedded resistors, illustrating another embodiment of the present invention.
Figure 5:
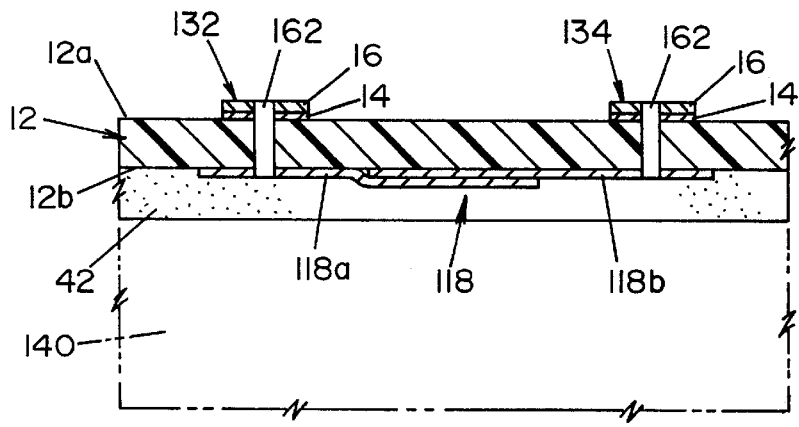
FIG. 5 is a cross-sectional view taken along lines 5—5 of FIG. 4.
Figure 5A:
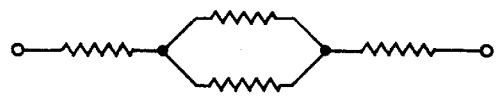
FIG. 5A is a schematic representation of the resistive element shown in FIG. 5.

The foregoing description is a specific embodiment of the present invention. It should be appreciated that this embodiment is described for the purpose of illustration only, and that numerous alterations and modifications may be practiced by those skilled in the art without departing from the spirit and scope of the invention. For example, FIGS. 4–5A show a component 110 illustrating another embodiment of the present invention. Component 110 is similar to component 10 in that it includes a polymeric film 12 having a first surface 12a and a second surface 12b. A flash layer 14 of a tiecoat metal is applied to surface 12a, and metallic layer 16 is applied to flash layer 14. As heretofore described, component 110 is similar to component 10 and therefore like elements have been designated with like reference numbers. In the embodiment shown, discrete areas 118 of overlapping resistive materials 118a and 118b are formed on side 12b of polymeric film 12. Areas 118 may be formed of overlapping metal layers of the type heretofore described, or may be comprised of overlapping layers of a polymer ink of the type heretofore described. Preferably, each layer 118a is different from layer 118b and has different resistive characteristics.

In a manner similar to that described above, component 110 is laminated as part of a multi-layer printed circuit to an inner core laminate 140. Through holes 162 connect the ends of resistive areas 118 to trace lines 132, 134 formed on the outer surface 16 of component 10. As described above, an embedded resistor is formed as a result of area 118 connecting trace lines 132, 134. Because of the overlapping region of area 118, the resultant embedded resistor has a resistive equivalent to that schematically illustrated in FIG. 5A. FIGS. 4–5A thus illustrate how various types of resistive components can be formed by overlaying materials having different resistive characteristics.

It is intended that all such modifications and alterations be included insofar as they come within the scope of the invention as claimed or the equivalents thereof.

Having described the invention, the following is claimed:

1. A multi-layer printed circuit, comprising:

a) an inner core formed from one or more printed circuit laminates, said printed circuit laminates comprised of a core substrate having a first surface with a strip conductor disposed thereon, b) at least one surface component attached to said inner core, said surface component, comprised of:

a film substrate formed of a first polymeric material;

at least one layer of copper on a first side of said film substrate; and a discrete area of a resistive material disposed on a second side of said film substrate, said surface component attached to said inner core with said discrete area of resistive material embedded within said multi-layer printed circuit between said core and said film substrate, c) a first through hole connecting one end of said discrete area to a first circuit trace line of said multi-layer printed circuit; and d) a second through hole connecting another end of said discrete area to a second trace line of said multi layer printed circuit.

2. A multi-layer printed circuit as defined in claim 1, wherein said resistive material is a metal or metal alloy having a resistivity greater than copper.

3. A multi-layer printed circuit as defined in claim 2, wherein said metal is selected from the group consisting of chromium, nickel, titanium, aluminum, vanadium, silicon, iron and alloys thereof.

4. A multi-layer printed circuit as defined in claim 1, wherein said resistive material is a polymer resistor ink.

5. A multi-layer printed circuit as defined in claim 1, wherein at least one layer of a flash metal is disposed between said polymeric material and said at least one layer of copper.

\* \* \* \* \*